United States Patent
Kinyua et al.

(10) Patent No.: US 7,385,536 B2
(45) Date of Patent: Jun. 10, 2008

(54) METHODS AND CIRCUITS FOR OUTPUT OF SAMPLE-AND-HOLD IN PIPELINED ADC

(75) Inventors: Martin Kithinji Kinyua, Dallas, TX (US); Franco Maloberti, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 11/012,015

(22) Filed: Dec. 14, 2004

(65) Prior Publication Data

US 2006/0125678 A1    Jun. 15, 2006

(51) Int. Cl.
*H03M 1/00*    (2006.01)
(52) U.S. Cl. .................. 341/122; 341/120; 341/155; 341/161
(58) Field of Classification Search .............. 341/122, 341/126, 155, 156, 123, 172, 161, 120, 118
See application file for complete search history.

(56) References Cited

U.S. PATENT DOCUMENTS

| | | | | |
|---|---|---|---|---|
| 5,847,600 | A * | 12/1998 | Brooks et al. .............. 330/9 |
| 5,909,382 | A * | 6/1999 | Neoh ..................... 708/141 |
| 6,127,958 | A * | 10/2000 | Chang et al. ............. 341/155 |
| 6,359,475 | B1 * | 3/2002 | Brunolli ................... 327/94 |
| 6,384,757 | B1 * | 5/2002 | Kosonen ................... 341/120 |
| 6,476,664 | B2 * | 11/2002 | Rolandi et al. ............ 327/534 |
| 6,516,612 | B1 * | 2/2003 | Yokoi et al. ............... 60/301 |
| 6,608,504 | B2 * | 8/2003 | Fujimoto .................... 327/94 |
| 6,839,015 | B1 * | 1/2005 | Sutardja et al. ............ 341/161 |
| 6,967,611 | B2 * | 11/2005 | Atriss et al. .............. 341/172 |
| 7,106,240 | B2 * | 9/2006 | Cringean .................. 341/163 |
| 7,289,777 | B2 * | 10/2007 | Mohsen et al. .......... 455/127.1 |
| 2005/0140433 | A1 * | 6/2005 | Maloberti et al. ............. 330/9 |
| 2005/0140537 | A1 * | 6/2005 | Waltari ..................... 341/162 |
| 2006/0077086 | A1 * | 4/2006 | Cringean ................... 341/155 |
| 2006/0182266 | A1 * | 8/2006 | Cusinato et al. ........... 379/395 |

* cited by examiner

*Primary Examiner*—Linh V Nguyen
(74) *Attorney, Agent, or Firm*—Warren L. Franz; Wade J. Brady, III; Frederick J. Telecky, Jr.

(57) ABSTRACT

Methods and circuit embodiments are disclosed for implementing an improved signal path for a sample-and-hold output. In exemplary embodiments, a sample-and-hold signal path for use in a pipelined ADC includes a sample-and-hold circuit configured to operate in two distinct phases. The sample-and-hold circuit includes an input node, an output node, and a power supply node. The power supply node is configured to power down the op amp during one phase and power up the op amp during the other phase. The sample-and-hold stage is configured to provide output during one phase only. Other aspects of the invention include embodiments in which a sample-and-hold stage signal path in a pipelined analog-to-digital converter is configured to accommodate a plurality of parallel outputs.

8 Claims, 2 Drawing Sheets

METHODS AND CIRCUITS FOR OUTPUT OF SAMPLE-AND-HOLD IN PIPELINED ADC

TECHNICAL FIELD

The invention relates to analog-to-digital conversion, hereinafter ADC, in electronic signal processing. More particularly, the invention relates to methods and circuits for operably coupling a sample-and-hold amplifier output node with an associated pipelined ADC system.

BACKGROUND OF THE INVENTION

The pipelined ADC is a popular ADC system architecture used in a wide variety of applications including for example, digital imaging, data transmission, and wireless communications. In general, an analog input signal is sampled and held while a first stage quantizes the sample into digital bits. The digitized sample is then fed into a digital-to-analog converter, hereinafter DAC, and the resulting analog output is subtracted from the original sample. The residue thus obtained is then typically gained up by a desired gain factor and passed to a next similar stage. The process is repeated as the sample continues through additional stages of the pipeline.

The high throughput of the pipelining process is facilitated by the sample-and-hold capability embedded within each stage. Due to the sample-and-hold, as soon as a given stage finishes processing a sample, it can begin processing a subsequent sample. In most pipelined ADCs implemented with CMOS technology, the sample-and-hold is implemented along with the gain amplifier and multiplying-digital-to-analog converter (MDAC) as a single switched-capacitor capacitor circuit block. It is known in the arts to couple the output node of a sample-and-hold circuit to the following pipeline stage during certain clock phases using MOS switches. Problems exist, however, in the implementation of the switching mechanisms themselves, including the inevitable resistance of the MOS switch, which tends to vary as a function of the input voltage. As a result, settling times and harmonic distortion can be increased.

Referring to FIG. 1, a representative example of a prior art circuit 10 is shown. Two operational phases are assumed, arbitrarily denominated "phase 1" and "phase 2" for the purposes of discussion. During phase 1, switches A and B are in the "on" state and capacitor C1 charges at the input voltage. During phase 2, switch D puts the capacitor C1 into feedback mode and switch E tracks the input voltage. In operation, particularly at high frequencies, the "on" resistance of switch E creates problems, specifically settling degradation and harmonic distortion. It can be seen that during phase 1, the input of the op amp 12 is shorted to ground at switch B. Therefore, assuming zero offset, the output OUT of the opamp 12 would be expected to be zero as well. Because of offsets however, the output node OUT tends to saturate at the level of either the power supply VDD or ground rail VSS. In order to avoid this, switch F is used to connect the op amp output node OUT to ground. The circuit 10 of FIG. 1 typifies the prior art approach to alleviating the effects of the current due to amplifier offset. Those skilled in the arts will realize that the voltage at the output node OUT' is controlled in some way during phase 1. For example, in a 1.5 bit per stage pipeline, the output node OUT' is controlled by a multiplying-digital-to-analog Converter (MDAC) 14.

Efforts to address the problems of non-linear switch resistance can lead to often increasingly complex switch bootstrapping arrangements, which require further implementation tradeoffs between increased circuit area and increased parasitic capacitances. Due to these and other problems, improved circuits and methods for implementing sample-and-hold functions in pipelined ADCs would be useful and advantageous in the arts.

SUMMARY OF THE INVENTION

In carrying out the principles of the present invention, in accordance with preferred embodiments thereof, an improved signal path is provided for a sample-and-hold output in a pipelined ADC.

According to a preferred embodiment, the invention provides a sample-and-hold signal path in a pipelined ADC that includes an op amp circuit having an input node, and an output node configured to operate in a first phase and a second phase wherein the sample-and-hold signal path is adapted to provide output to the output node during one phase only.

According to one aspect of the invention, a sample-and-hold signal path for use in a pipelined ADC includes an op amp circuit configured to operate in two distinct phases. The op amp circuit includes an input node, an output node, and a power supply node. The power supply node may be configured to power down the op amp during the first phase and power up the op amp during the second phase. The sample-and-hold stage is configured to provide output during the second phase only.

According to another aspect of the invention, a method of outputting a signal from a sample-and-hold in a pipelined ADC includes steps for operating the sample-and-hold in a first phase and a second phase, alternately activating and deactivating the sample-and-hold outputs during each successive phase. The sample-and-hold is adapted to provide stage output during one phase only.

According to another aspect of the invention, methods of outputting a signal from a sample-and-hold include the operation of the sample-and-hold in a first phase and a second phase. Steps further include turning off the sample-and-hold during the first phase and turning on the sample-and-hold during the second phase. The sample-and-hold provides stage output during the second phase only.

According to another aspect of the invention, embodiments are disclosed in which a sample-and-hold stage signal path in a pipelined analog-to-digital converter can accommodate a plurality of parallel output nodes.

According to still another aspect of the invention, embodiments are disclosed in which the number of switches in the signal path of a sample-and-hold is reduced.

The invention has numerous advantages including but not limited to providing methods and circuits for the implementation of pipelined ADCs with reduced harmonic distortion. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various figures unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1:
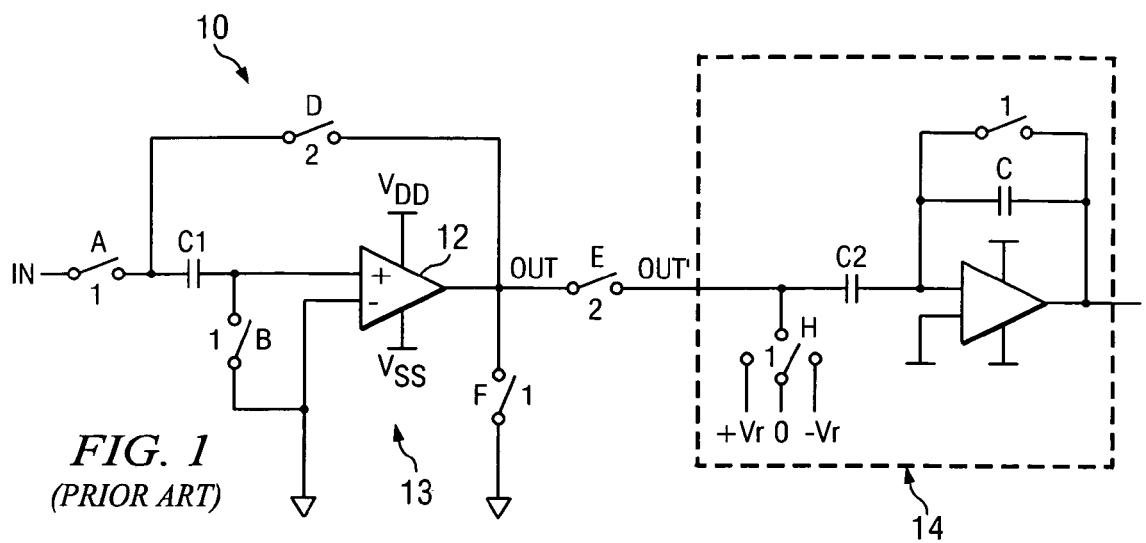
FIG. 1 (prior art) is a simplified schematic circuit diagram representative of an implementation of a switched capacitor sample-and-hold stage known in the arts.
Figure 2:
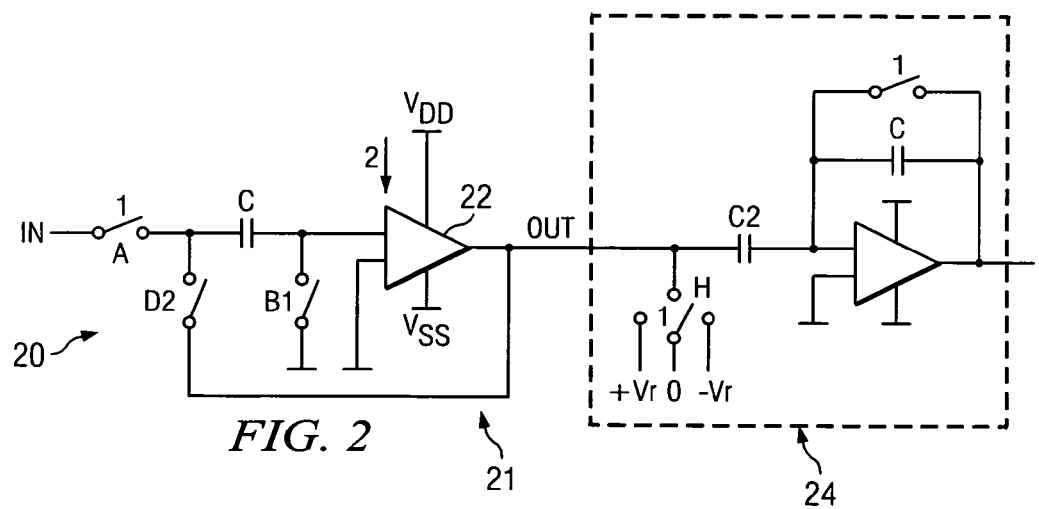
FIG. 2 is a simplified schematic circuit diagram illustrating an example of a preferred embodiment of the invention.

In general, the invention provides methods and circuits for improving upon sample-and-hold and gain stages such as those used in pipelined ADCs. FIG. 2 shows an example of a preferred embodiment of a 1.5 bit input stage configuration 20 according to the invention. It should be observed that the circuit 20 has a sample-and-hold circuit 21 including an op amp 22 with an output node OUT operably coupled to an associated MDAC 24. It can be seen that during phase 1 operation, the input of the op amp 22 is shorted to ground at switch B. The output node OUT, however is not decoupled from the MDAC 24 using the traditional decoupling switches known in the arts. The MDAC 24 provides charge via switch H at the output node OUT. The mismatch current caused by the input offset voltage of 22 is avoided by turning off the power to the output legs of opamp 22 during phase 1, as indicated by the arrow "2" showing the amplifier is active during phase 2. Those skilled in the arts will appreciate that powering down the output stage 20 during phase 1 using a scheme as shown in the example of FIG. 2 functionally decouples the output node OUT from the associated circuitry 24, advantageously eliminating the decoupling switches known in the arts; e.g., switch E in FIG. 1 (prior art).

The principles and circuits of the invention may be extended to more complex implementations in various alternative embodiments. For example, now referring primarily to FIG. 3, an exemplary embodiment of the invention is shown to be applicable in cases where a pipelined stage controlled by a sample-and-hold requires two or more independent connections, as in the case of a multi-bit MDAC implementation. The circuit 30 shown has a sample-and-hold 32 similar to that discussed herein with respect to FIG. 2. Note, however, that the sample-and-hold 32, and thus the op amp 34, has two output nodes, OUT1 and OUT2. The MDAC 36 in this example has two independent connection paths to the output nodes OUT1, OUT2. Examination of FIG. 3 will reveal that the two capacitors C3 in the MDAC 36 are charged by the sample-and-hold 32 outputs OUT1, OUT2 during phase 2.

It can be seen that during phase 1 operation, the input of the op amp 34 is shorted to ground at switch B1. The MDAC 36 provides charge via switch H at the output node OUT2. The mismatch current problem in circuits common in the arts is avoided by turning off the op amp 34 during phase 1, as indicated. Powering down the output stage of 32 during phase 1, as shown, decouples the output nodes OUT1 and OUT2 from the associated MDAC circuitry 36. Although two parallel output nodes OUT1, OUT2, are shown in this example of a preferred embodiment of the invention, it should be appreciated by those skilled in the arts that more numerous parallel paths may be used without departure from the scope of the invention.

Figure 3:
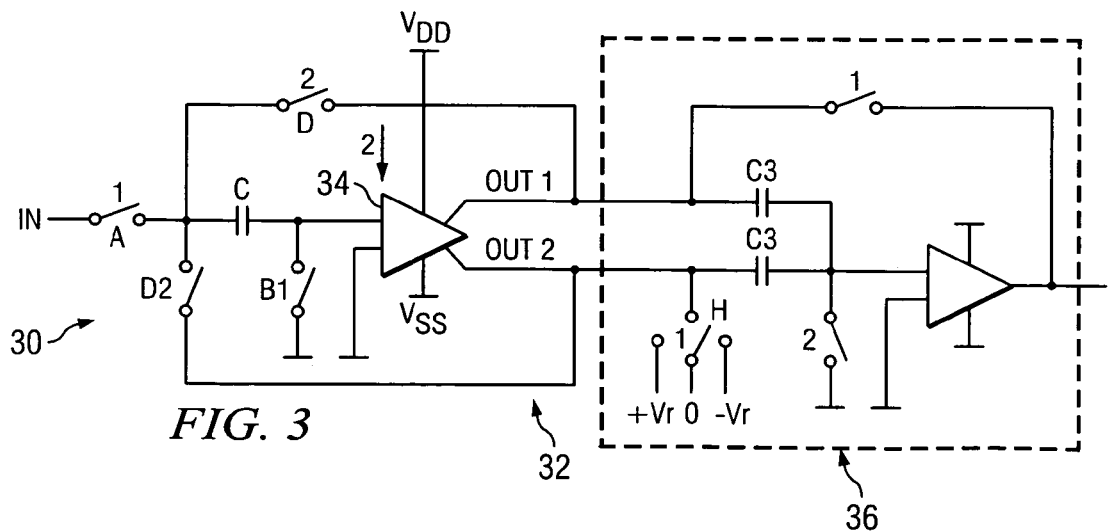
FIG. 3 is a simplified schematic circuit diagram illustrating an example of an alternative preferred embodiment of the invention.
Figure 4:
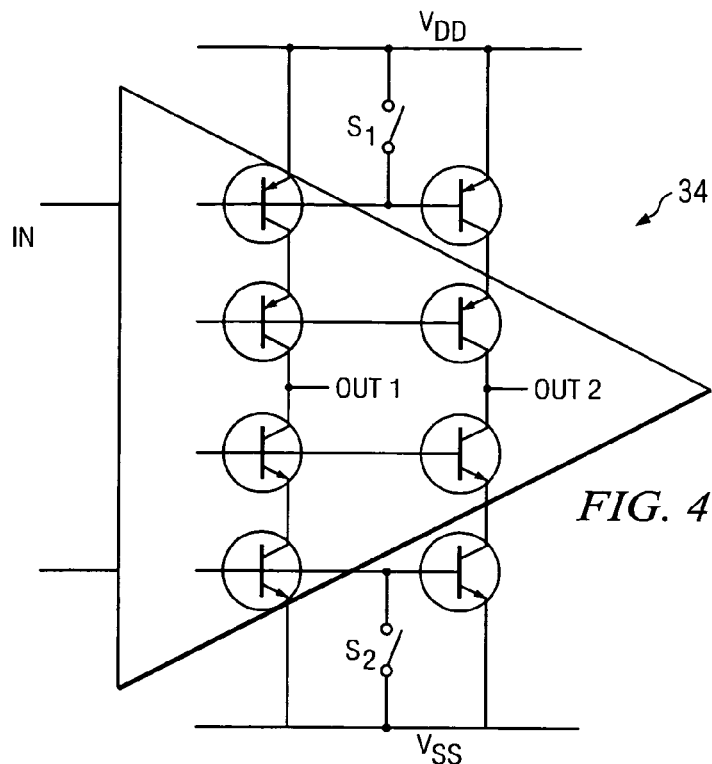
FIG. 4 is a simplified schematic circuit diagram showing a close-up view of an example of an op amp used in the alternative preferred embodiment of the invention of FIG. 3.

FIG. 4 shows a close-up schematic view of an exemplary embodiment of an op amp 34 with multiple outputs, demonstrating the splitting of the output stage into two parallel branches, OUT1 and OUT2 as shown in, and described with reference to, FIG. 3. It should be emphasized that the outputs OUT1, OUT2, are identical and parallel, and that the op amp 34 as shown is not to be confused with a fully differential amplifier. This does not preclude it from being implemented in fully differential form in practice.

Figure 5:
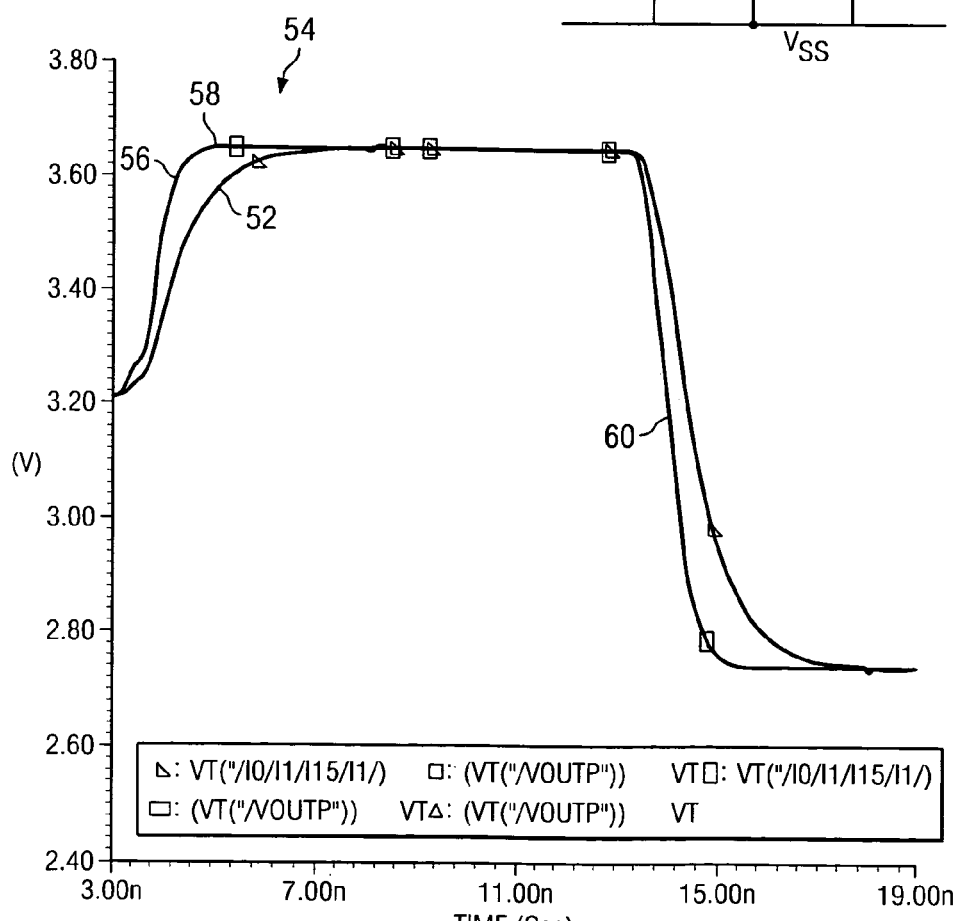
FIG. 5 is a graphical representation of an example of the voltage measured at the output node of an example of a preferred embodiment as shown in FIG. 3.

A graphical representation of the operation of the invention is shown in FIG. 5. Representative time and voltage intervals are shown on the x-axis and y-axis respectively. These values are presented in the context of a selected exemplary pipelined ADC and are not intended to limit or constrain the interpretation of the invention. The voltage response of a representative example of a prior art circuit, such as that shown in FIG. 1 is illustrated by trace 52. The voltage response of a circuit according to the invention, such as that shown in FIGS. 2 and 3, is shown by trace 54. It should be noted that the trace 54 representing the response of the circuits of the invention is steeper initially 56 and settles 58 more quickly than that of the prior art circuit 52. The voltage 54 of the circuit of the invention also falls off 60 notably more steeply.

The methods and devices of the invention provide advantages including but not limited to eliminating the sampling switch at the output of a sample-and-hold amplifier in a pipelined A/D converter. The invention realizes improved settling times, reduced harmonic distortion, and more rapid sampling capabilities. While the invention has been described with reference to certain illustrative embodiments, the methods and systems described are not intended to be construed in a limiting sense. Various modifications and combinations of the illustrative embodiments as well as other advantages and embodiments of the invention will be apparent to persons skilled in the art upon reference to the description and claims.

We claim:

1. In a pipelined analog-to-digital converter, a sample-and-hold signal path, comprising:
    an op amp circuit configured to operate in a first phase and a second phase, the op amp circuit further comprising an input node, and an output node;
    wherein the sample and hold signal path is adapted to sample a signal at said output node and to power down said output node in said first phase, and to hold the sampled signal and to provide output to the output node only during said second phase.

2. A sample-and-hold signal path in a pipelined analog-to-digital converter according to claim 1, wherein the op amp circuit further comprises a plurality of parallel, single-ended output nodes.

3. A sample-and-hold signal path in a pipelined analog-to-digital converter according to claim 1, wherein the op amp circuit further comprises two parallel, single-ended output nodes.

4. A sample-and-hold signal path in a pipelined analog-to-digital converter according to claim 1 further comprising a power supply node configured to power down the op amp during said first phase and power up the op amp during said second phase.

5. In a pipelined analog-to-digital converter, a method of outputting a signal from a sample-and-hold signal path including an op amp having an input node and an output node, comprising the steps of:

operating the sample-and-hold to sample a signal at said input node and to power down said output node in a first phase, and to hold the sampled signal and to provide output to said output node only during a second phase; and alternately activating and deactivating said op amp output during each of a plurality of successive first and second phases.

6. A method according to claim 5 wherein said op amp output comprises a plurality of parallel, single-ended output signals.

7. A method according to claim 5, wherein said op amp output comprises two parallel, single-ended output signals.

8. A method according to claim 5, wherein operating the sample-and-hold in a first phase and a second phase further comprises the steps of alternately activating and deactivating the op amp output during each successive phase by alternately turning the op amp output on and off.

* * * * *